(12) United States Patent
Akita et al.

(10) Patent No.: US 6,333,658 B1
(45) Date of Patent: Dec. 25, 2001

(54) ANALOG SYNCHRONIZATION CIRCUIT

(75) Inventors: Hironobu Akita; Satoshi Eto, both of Yokohama; Katsuaki Isobe, Kawasaki; Masaharu Wada; Haruki Toda, both of Yokohama, all of (JP)

(73) Assignees: Kabushiki Kaisha Toshiba, Kawasaki; Fujitsu Limited, Kanagawa, both of (JP)

( * ) Notice: Subject to any disclaimer, the term of this patent is extended or adjusted under 35 U.S.C. 154(b) by 0 days.

(21) Appl. No.: 09/707,791

(22) Filed: Nov. 8, 2000

(30) Foreign Application Priority Data

Nov. 15, 1999 (JP) ................................. 11-324202

(51) Int. Cl.⁷ ..................................... H03H 11/26
(52) U.S. Cl. ........................... 327/280; 327/284; 327/161
(58) Field of Search ..................................... 327/271, 276, 327/277, 278, 280, 281, 284, 287, 288, 141, 153, 154, 161

(56) References Cited

U.S. PATENT DOCUMENTS

| | | | |
|---|---|---|---|
| 3,906,247 | * 9/1975 | Heffner | 327/263 |
| 4,736,118 | * 4/1988 | Fischer | 327/175 |
| 5,015,892 | * 5/1991 | Parsi et al. | 327/276 |
| 5,867,432 | 2/1999 | Toda | 365/194 |
| 5,955,905 | * 9/1999 | Idei et al. | 327/160 |
| 5,986,949 | 11/1999 | Toda | 365/194 |
| 6,034,901 | 3/2000 | Toda | 365/195 |
| 6,069,508 | * 5/2000 | Takai | 327/161 |
| 6,121,811 | * 9/2000 | Scott et al. | 327/276 |
| 6,194,937 | * 2/2001 | Minami | 327/270 |

OTHER PUBLICATIONS

T. Saeki, et al., "A 2.5ns Clock Access 250MHz 256Mb SDRAM with a Synchronous Mirror Delay", ISSCC Digest of Technical Papers, pp. 374–375, Feb. 1996.
D. Shim, et al., "An Analog Synchronous Mirror Delay for High–Speed DRAM Application", IEEE Journal of Solid–State Circuits, vol. 34, No. 4, Apr. 1999.
U.S. application No. 09/628,449, filed Jul. 28, 2000; entitled "Analog Synchronization Circuit for Synchronizing External and Internal Clock Signals" to Haruki Toda, et al.

* cited by examiner

Primary Examiner—Timothy P. Callahan
Assistant Examiner—Hai L. Nguyen
(74) Attorney, Agent, or Firm—Banner & Witcoff, Ltd.

(57) ABSTRACT

An analog synchronization circuit includes an input buffer which is supplied with an external clock signal, a delay monitor which is supplied with a clock signal output from the input buffer, an output buffer for outputting a clock signal synchronous with the external clock signal and two charge balance delay circuits. The two charge balance delay circuits are equivalent to delay lines in a mirror type delay locked loop. Each charge balance delay circuits operates once in two consecutive cycles of the external clock signal. The two charge balance delay circuits alternately operate and output signals of the charge balance delay circuits are supplied to the output buffer via an OR gate. First and second capacitors are provided in each charge balance delay circuits. A first current source circuit charges the first capacitor for a time equivalent to a delay time of a forward pulse. The second capacitor is charged by a second current source circuit. A comparator compares charge voltages of the first and second capacitors with each other and generates a timing signal when both charge voltages coincide with each other.

15 Claims, 11 Drawing Sheets

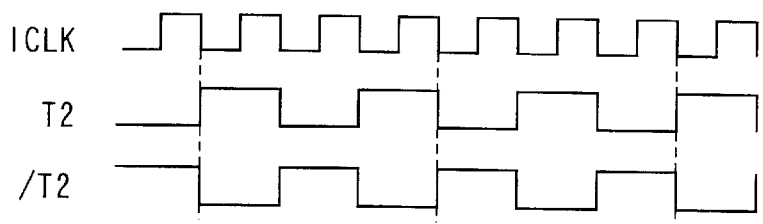
FIG. 4
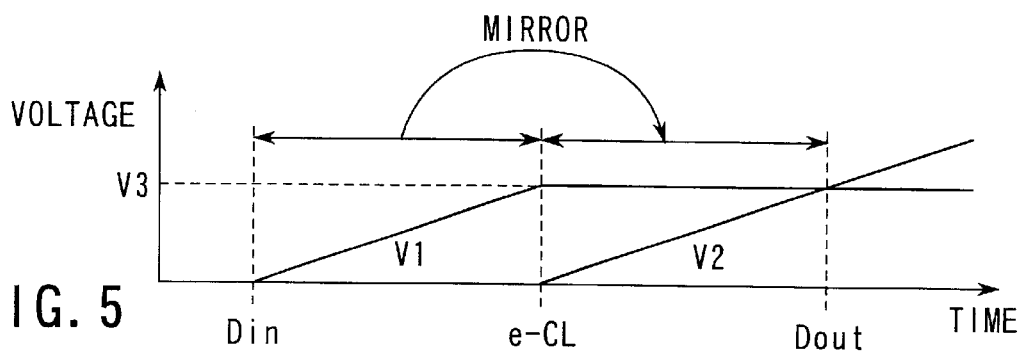
FIG. 5
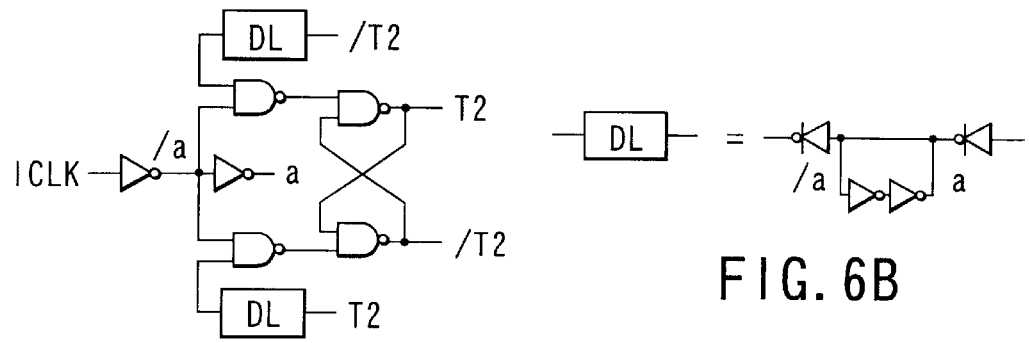
FIG. 6A
FIG. 6B
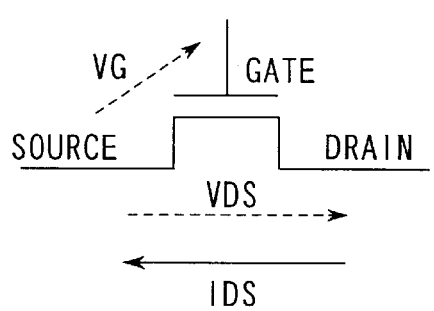
FIG. 7
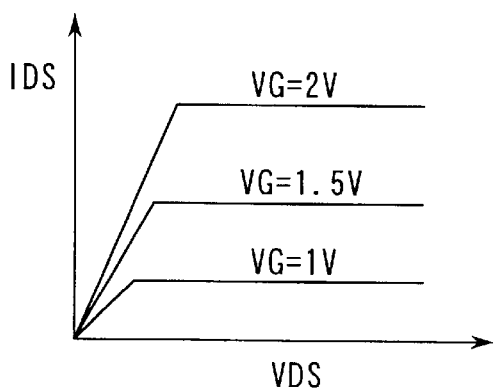
FIG. 8

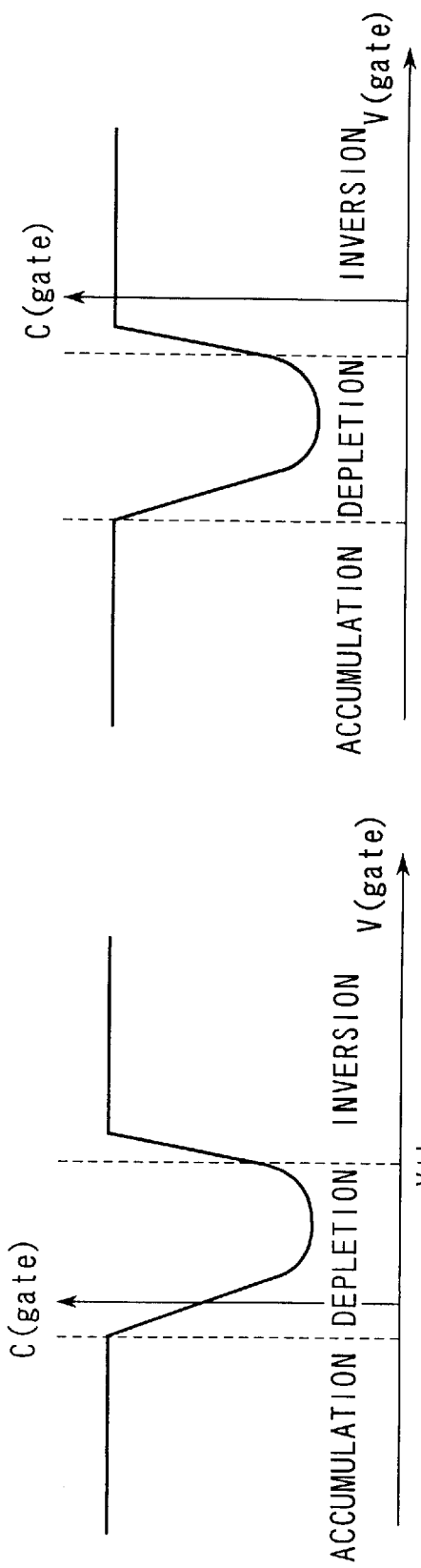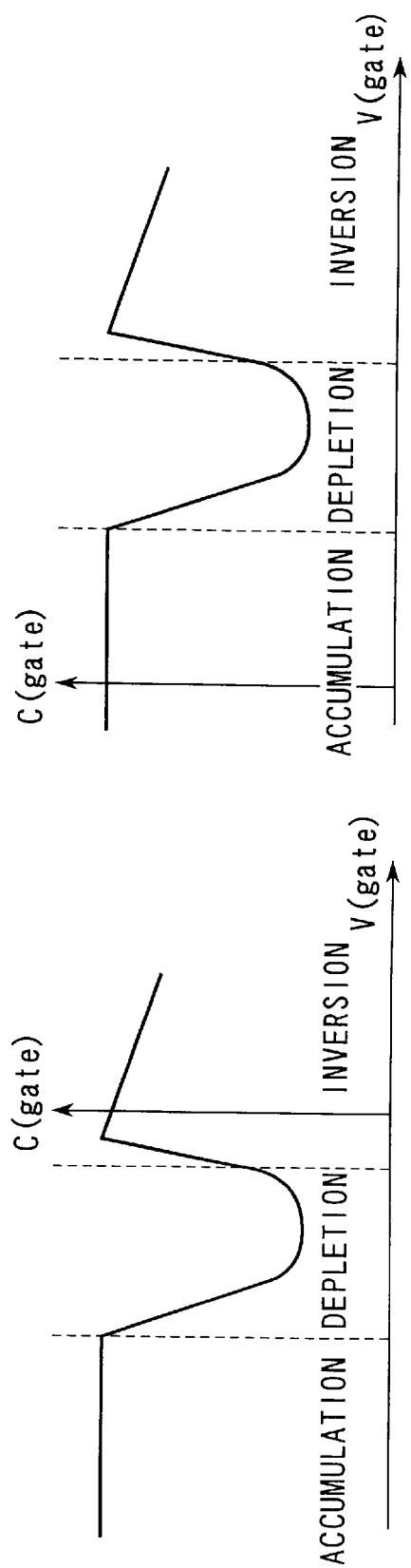

ANALOG SYNCHRONIZATION CIRCUIT

CROSS-REFERENCE TO RELATED APPLICATIONS

This application is based upon and claims the benefit of priority from the prior Japanese Patent Application No. 11-324202, filed Nov. 15, 1999, the entire contents of which are incorporated herein by reference.

BACKGROUND OF THE INVENTION

The present invention relates to an analog synchronization circuit which is provided in a semiconductor memory device, such as a synchronous DRAM, and generates, from an external clock signal, an internal clock signal synchronous with this external clock signal.

This type of semiconductor memory device requires that the internal clock signal generated inside a chip should be synchronized with an external clock signal supplied from outside the chip. When the external clock signal is received at an input buffer in the chip and is distributed inside the chip, the phase of the clock signal inside the chip differs from the phase of the clock signal outside the chip due to delays made by buffers and lines. To avoid this shortcoming, various synchronization circuits which synchronize the internal clock signal with the external clock signal have been developed.

As such synchronization circuits, there are mirror type DLLs (Delay Locked Loops) which include an SMD (Synchronous Mirror Delay) used in, for example, "A 2.5 ns Clock Access 250 MHz 256 Mb SDRAM with a Synchronous Mirror Delay" by T. Saeki, et al., ISSCC Digest of Technical Papers, pp. 374–375, February 1996, and an STBD (Synchronous Traced Backward Delay) described in the U.S. Pat. Nos. 5,867,432, 5,986,949, and 6,034,901. The mirror type DLL has a fast synchronization speed and can generate an internal clock signal synchronous with an external clock signal from the third clock of the external clock signal.

FIG. 1 shows one example of a conventional mirror type DLL. This mirror type DLL comprises an input buffer IB, an output buffer OB, a delay monitor DM which is a replica circuit of those buffers, and a delay line DL. The delay line DL comprises a forward pulse delay line DL1 and a backward pulse delay line DL2, and a analog synchronization operation is carried out by a mirror operation which reflects the delay time on the forward pulse delay line DL1 onto the backward pulse delay line DL2. An important factor in determining the synchronization precision is how to accurately make the delay times on both delay lines equal to each other.

The conventional delay line DL is constituted by connecting a plurality of logic gates, such as inverter circuits, in series. The delay time on the delay line is determined by how many stages of logic gates, which constitute the backward pulse delay line DL2, a backward pulse passes based on information on how many stages of logic gates, which constitute the forward pulse delay line DL1, a forward pulse has passed. Apparently, the delay time becomes a quantized quantity which is the number of stages of logic gates.

As shown in FIG. 2, therefore, the amount of delay on the forward pulse delay line does not become equal to the amount of delay on the backward pulse delay line, thus generating a quantization error.

BRIEF SUMMARY OF THE INVENTION

Accordingly, it is an object of the present invention to provide an analog synchronization circuit which can prevent the generation of a quantization error and can make the delay amount of a forward pulse substantially equal to the delay amount of a backward pulse.

To achieve the above object, according to one aspect of this invention, there is provided an analog synchronization circuit which comprises a first capacitor; a first current source circuit for starting charging the first capacitor in accordance with a first clock signal and stopping the charging in accordance with a second clock signal delayed from the first clock signal; a second capacitor; a second current source circuit for starting charging the second capacitor in accordance with the second clock signal; and a comparator circuit for comparing charge voltages of the first and second capacitors with each other and generating a timing signal when the charge voltages coincide with each other, and in which the comparator circuit includes a first switch having one end supplied with the charge voltage of the first capacitor, a second switch having one end supplied with the charge voltage of the second capacitor and the other end connected to the other end of the first switch, a third capacitor having one end connected to a common node between the other ends of the first and second switches, a first amplifier circuit having an input node connected to the other end of the third capacitor and an output node from which the timing signal is output, and a third switch for controlling supply of a voltage equivalent to a threshold voltage of the first amplifier circuit to the other end of the third capacitor, wherein when the first and third switches are enabled, the second switch is controlled to be disabled, and when the second switch is enabled, the first and third switches are controlled to be disabled.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a waveform chart of some signals which are used in the circuit in FIG. 3;

FIG. 5 is a signal waveform chart for explaining the operation of the circuit in FIG. 3;

FIGS. 6A and 6B are circuit diagrams of a circuit for generating some signals which are used in the circuit in FIG. 3;

FIG. 7 is a symbol diagram for explaining the principle of a constant current source circuit which is used in the circuit in FIG. 3;

FIG. 8 is a characteristic diagram for explaining the principle of the constant current source circuit which is used in the circuit in FIG. 3;

FIGS. 24A through 24D are characteristic diagrams illustrating relationships between a gate voltage V(gate) and a capacitance C(gate) with respect to the back-gate of an N channel MOS transistor to be used in each of individual embodiments including fourth and fifth embodiments of this invention;

DETAILED DESCRIPTION OF THE INVENTION

Preferred embodiments of the present invention will now be described with reference to the accompanying drawings.

(First Embodiment)

Figure 1:
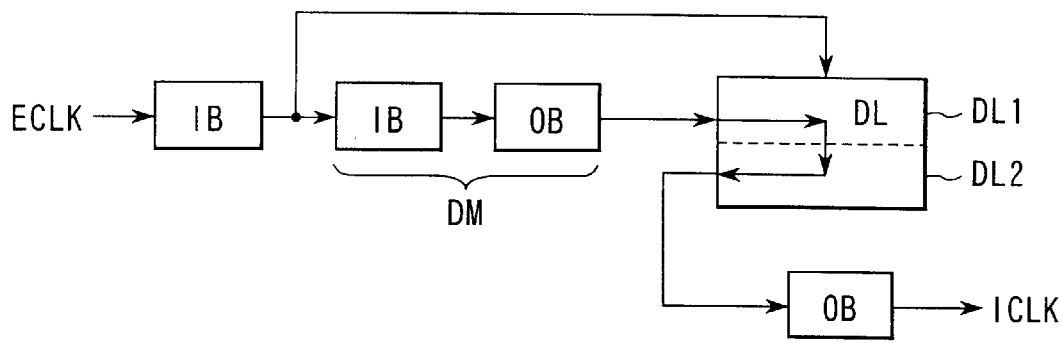
FIG. 1 is a block diagram showing one example of a conventional mirror type DLL.
Figure 2:
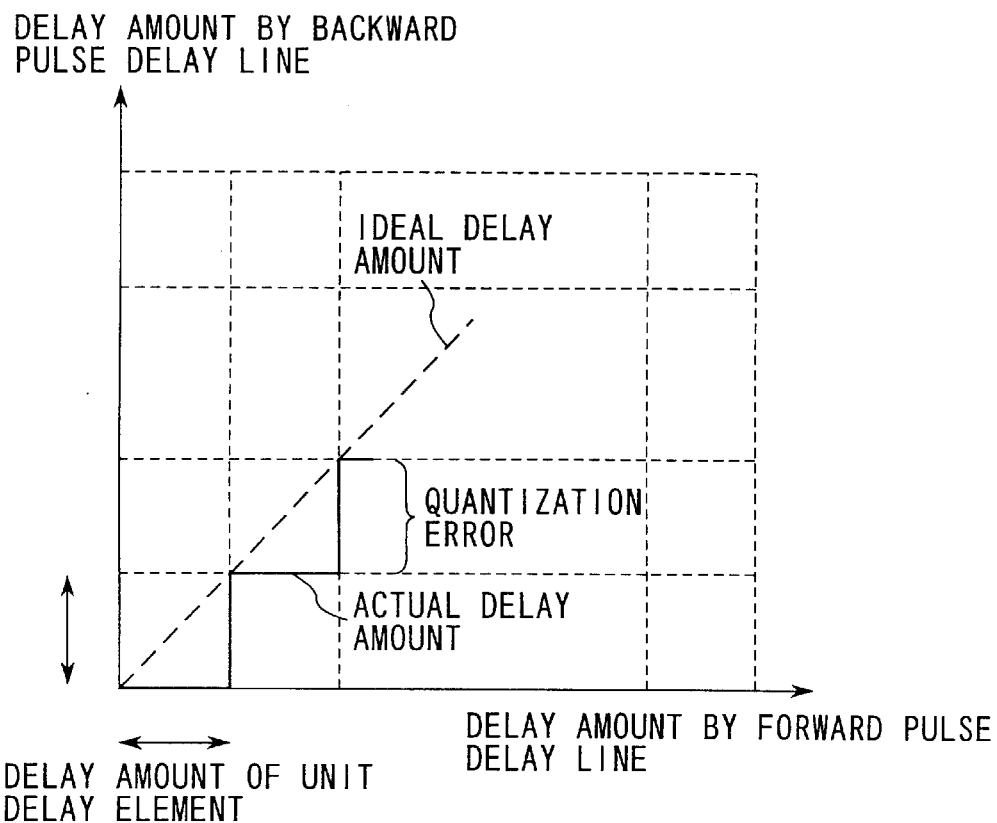
FIG. 2 is a characteristic diagram for explaining the conventional problem.
Figure 3:
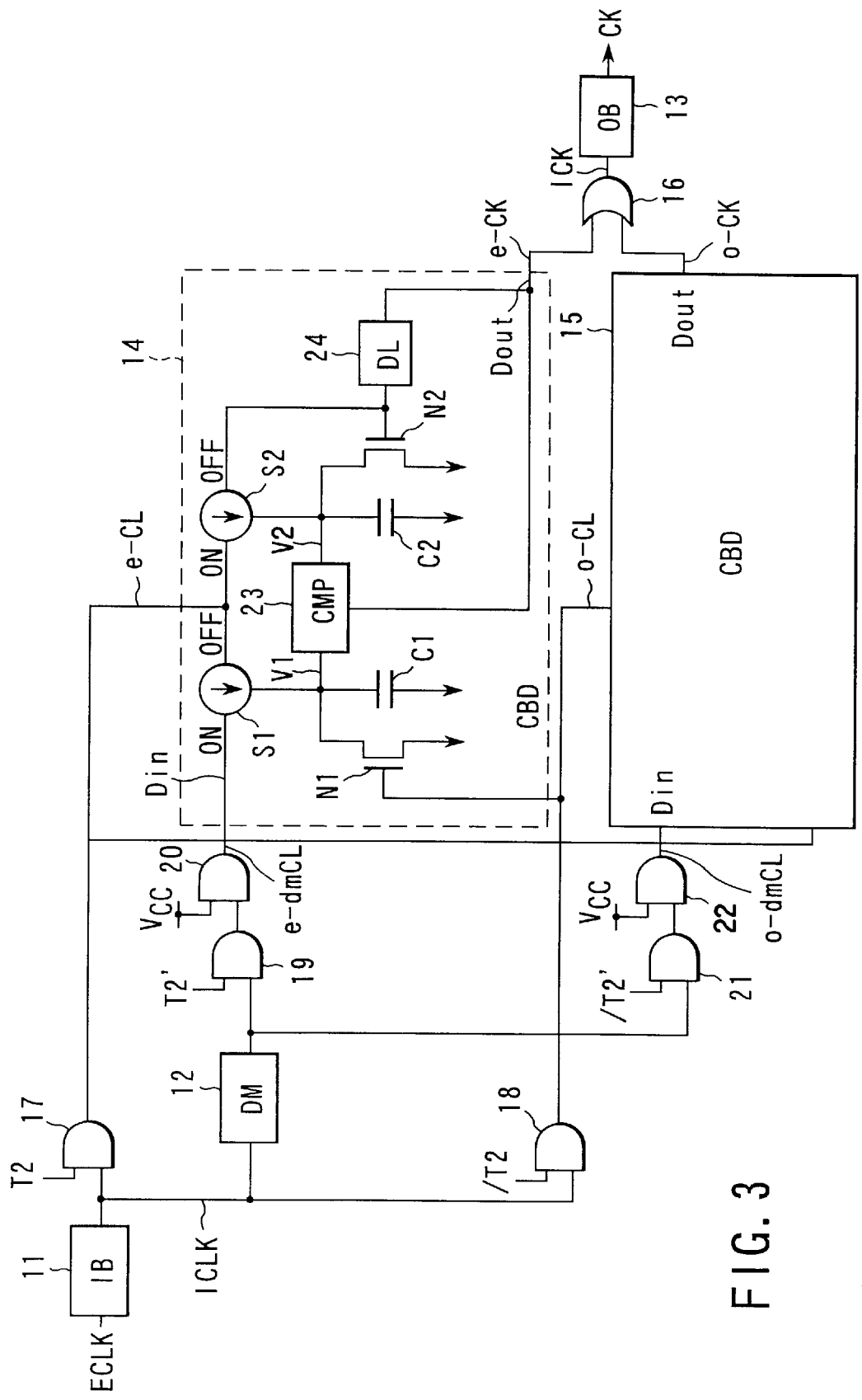
FIG. 3 is a general circuit diagram of an analog synchronization circuit according to a first embodiment of this invention.

FIG. 3 shows the general circuit structure of an analog synchronization circuit described in Jpn. Pat. Application No. 11-228710, the entire contents of which are incorporated by reference herein. This circuit basically has a structure similar to the structure of a mirror type DLL, and comprises an input buffer (IB) 11 to which an external clock signal ECLK is supplied, a delay monitor (DM) 12 to which a clock signal ICLK output from the input buffer 11 is supplied, and an output buffer (OB) 13 which outputs a clock signal CK synchronous with the external clock signal ECLK.

This circuit further has two charge balance delays (each hereinafter abbreviated as "CBD") 14 and 15. Those CBDs 14 and 15 are equivalent to delay lines in the conventional mirror type DLL. Each CBD 14 or 15 operates once in two consecutive cycles of the external clock signal, as will be discussed later. The two CBDs 14 and 15 alternately operate and the output signals of the two CBDs 14 and 15 are supplied to the output buffer 13 via an OR gate 16.

AND gates 17 and 18 in FIG. 3 distribute the clock signal ICLK in accordance with signals T2 and /T2 ("/" indicating an inverted signal) in order to allow the two CBDs 14 and 15 to operate alternately. The signal T2 is produced by frequency-dividing the clock signal ICLK.

FIG. 4 shows the phase relationship among the clock signal ICLK and the signals T2 and /T2 which are used in the circuit in FIG. 3.

To ensure the aforementioned alternate operation, clock signals e-CL and o-CL respectively input to the CBDs 14 and 15 are each delayed from the clock signal ICLK by one AND gate. To compensate for this delay, a series circuit of AND gates 19 and 20 and a series circuit of AND gates 21 and 22 are provided at the subsequent stage of the delay monitor 12. The AND gates 20 and 22 are dummy circuits whose one input nodes to connected to an H-level potential, e.g., a supply voltage $V_{CC}$. Signals T2' and /T2' are respectively supplied to one input nodes of the AND gates 19 and 21. Those signals T2' and /T2' are timing adjusting signals produced by properly delaying the signals T2 and /T2.

As the CBDs 14 and 15 have the same structure, the internal structure of the CBD 14 as a representative will now be described. The CBD 14 comprises two capacitors C1 and C2, constant current source circuits S1 and S2 for respectively charging the capacitors C1 and C2, a comparator (CMP) 23 for comparing charge voltages V1 and V2 in the capacitors C1 and C2 with each other, N channel MOS transistors N1 and N2 for discharging the charge voltages of the capacitors C1 and C2 to reset the capacitors, and a delay circuit (DL) 24. The capacitor C1 is equivalent to a forward pulse delay line and the capacitor C2 is equivalent to a backward pulse delay line.

The capacitances of the capacitors C1 and C2 are set substantially equal to each other, and the amounts of currents of the constant current source circuits S1 and S2 are also set substantially equal to each other. The constant current source circuit S1 starts outputting the current in accordance with a pulse signal e-dmCL supplied to an input node Din of the CBD 14, and stops the current outputting operation in accordance with the pulse signal e-CL. The constant current source circuit S2 starts a current outputting operation in accordance with the pulse signal e-CL and stops the current outputting operation in accordance with a signal obtained by delaying a pulse signal e-CK output from the comparator 23 by the delay circuit 24.

The reset transistor N1 is controlled in accordance with the clock signal o-CL output from the AND gate 18, and the transistor N2 is controlled in accordance with the output signal of the delay circuit 24. The detailed structures of the constant current source circuits S1 and S2 and the comparator 23 will be discussed later.

Referring now to FIG. 5, the operation of the CBD 14 will be explained. When the pulse signal e-dmCL output from the AND gate 20 is supplied to the input node Din, the constant current source circuit S1 starts charging the capacitor C1. As the capacitor C1 is charged with a constant current, a voltage V1 at a node between the constant current source circuit S1 and the capacitor C1 increases at a given rate. When the pulse signal e-CL is supplied from the AND gate 17 later, charging of the capacitor C1 is stopped and charging of the capacitor C2 starts at the same time. When a voltage V2 at a node between the constant current source circuit S2 and the capacitor C2 becomes equal to the charge voltage V1 of the capacitor C1 after charging has stopped, the comparator 23 sends the pulse signal e-CK to an output node Dout. This pulse signal e-CK is supplied via the delay circuit 24 to the constant current source circuit S2, thus stopping the operation of the constant current source circuit S2.

Because the capacitances of the capacitors C1 and C2 are equal to each other and the current amounts of the constant current source circuits S1 and S2 are equal to each other, the time needed for the charge voltage V1 of the capacitor C1 to reach V3 becomes equal to the time needed for the charge voltage V2 of the capacitor C2 to reach V3. Accordingly, as shown in FIG. 5, the same time as the time from the supply of the pulse signal e-dmCL to the input node Din to the supply of the pulse signal e-CL is mirrored to the time from the supply of the pulse signal e-CL to the outputting of the pulse signal e-CK to the output node Dout. Because the voltages V1 and V2 shown in FIG. 5 are both analog quantities, no quantization error practically occurs at the time of mirroring the charge time.

The reset transistor N1 is enabled at the time the pulse signal o-CL output from the AND gate 18 is supplied to the CBD 15, thereby resetting the capacitor C1. The transistor N2 is enabled by the pulse signal e-CK from the comparator 23, after delayed by the delay circuit 24, thereby resetting the capacitor C2. The unillustrated transistor N1 in the CBD 15 is enabled by the pulse signal e-CL output from the AND gate 17, thereby resetting the capacitor C1 in the CBD 15.

FIG. 6A shows the structure of a part of a frequency-dividing circuit which produces the signals T2 and /T2 from the clock signal ICLK. FIG. 6B exemplifies a delay circuit (DL) which is used in the circuit in FIG. 6A. The operation of a clocked inverter circuit in the delay circuit shown in FIG. 6B is controlled by signals a and /a which are generated by the circuit in FIG. 6A.

FIGS. 7 and 8 illustrate the principle of the constant current source circuits S1 and S2 in FIG. 3. In this case, if a gate voltage VG of an N channel MOS transistor as shown in, for example, FIG. 7 is set properly, a current amount IDS does not change even when a voltage VDS between the drain and source of the MOS transistor varies. Therefore, the characteristic of the MOS transistor becomes as shown in FIG. 8 so that the MOS transistor can be used as a constant current source. A P channel MOS transistor as well as the N channel MOS transistor can also be used as a constant current source if the gate voltage is set adequately. In the case of charging the capacitor from the ground voltage, the source voltage does not change much so that a P channel MOS transistor, if used as a constant current source, has a better constant current characteristic than an N channel MOS transistor.

Figure 9A:
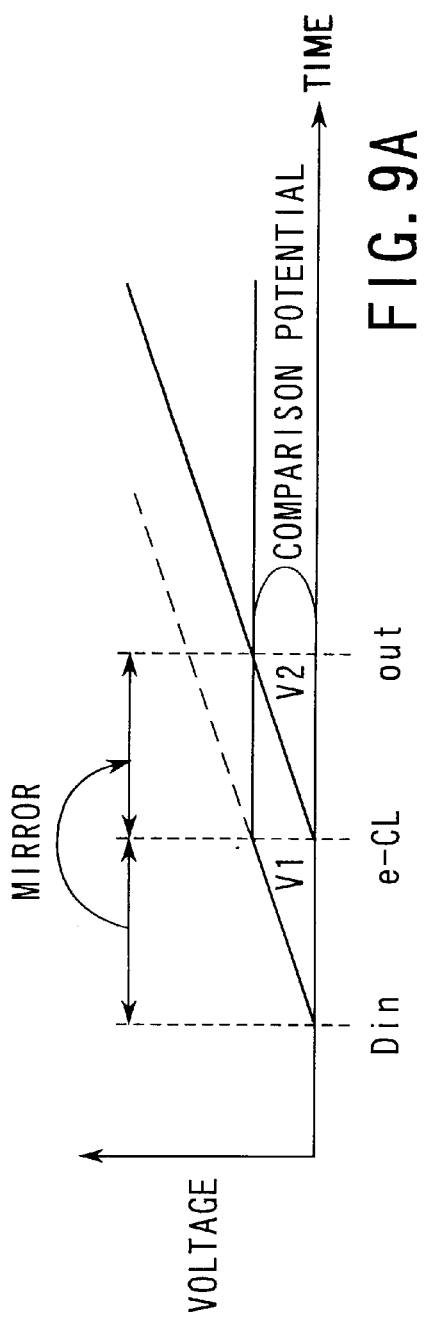
FIGS. 9A and 9B are signal waveform charts for explaining the operation of the circuit in FIG. 3.

In the aforementioned analogous mirror type DLL, when the frequency of the external clock signal ECLK varies, the charge times of the capacitors C1 and C2 in the CBDs 14 and 15 change and the voltage to be compared in the comparator 23 changes accordingly. FIG. 9A shows the transition of the charge voltages of the capacitors C1 and C2 when the frequency of the external clock signal ECLK is relatively high and the period is relatively short, and FIG. 9B shows the transition of the charge voltages of the capacitors C1 and C2 when the frequency of the external clock signal ECLK is relatively low and the period is relatively long.

Figure 9B:
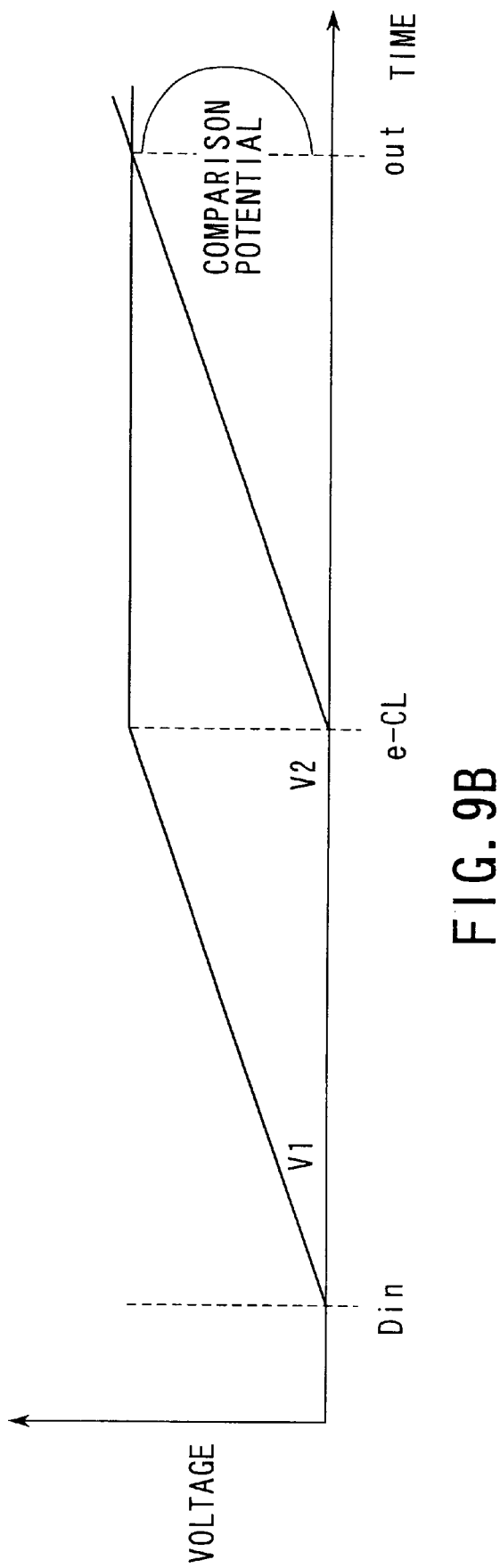

As apparent from FIGS. 9A and 9B, when the frequency of the external clock signal ECLK is relatively high, the periods for charging the capacitors C1 and C2 become shorter, so that the charge voltages do not rise much. When the frequency of the external clock signal ECLK is relatively low, the periods for charging the capacitors C1 and C2 become longer, making the charge voltages higher to a certain degree.

Figure 10A:
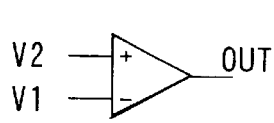
FIGS. 10A and 10B are a symbol diagram and a detailed circuit diagram of a differential amplifier circuit which is used in the circuit in FIG. 3.
Figure 10B:
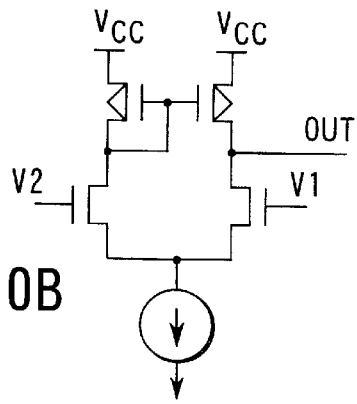

If an ordinary differential amplifier circuit as shown in, for example, a symbol diagram in FIG. 10A and a detailed circuit diagram in FIG. 10B is used as the comparator 23 in FIG. 3 under such a circumstance, the value of the charge voltage V1 that is supplied to the differential amplifier circuit as a reference voltage for comparison varies in accordance with the frequency, so that the delay time produced by the differential amplifier circuit itself also varies. As a result, the offset of the internal clock signal to the external clock signal changes, which hinders the high-precision synchronization operation in a wide frequency range.

Figure 11:
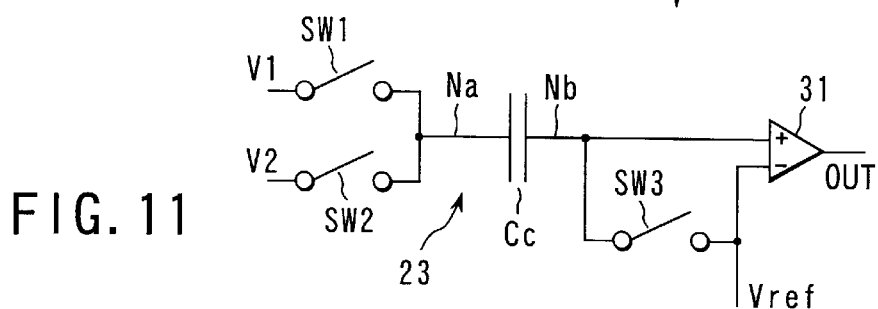
FIG. 11 is a circuit diagram showing the detailed structure of a comparator which is used in the circuit in FIG. 3.

This embodiment therefore uses the comparator 23 that has the structure as shown in FIG. 11. In the comparator shown in FIG. 11, the charge voltage V1 of the capacitor C1 is supplied to one end of a switch SW1. Likewise, the charge voltage V2 of the capacitor C2 is supplied to one end of a switch SW2. The other ends of the switches SW1 and SW2 are connected together at a common node Na. This common node Na is connected to one end of a capacitor Cc whose other end is connected to a positive-phase input node (+) of a differential amplifier circuit 31. The differential amplifier circuit 31 further has an opposite-phase input node (−) which is supplied with a constant voltage generated by an unillustrated circuit as a reference voltage Vref.

A common node Nb between the capacitor Cc and the positive-phase input node of the differential amplifier circuit 31 is connected to one end of a switch SW3. The other end of the switch SW3 is connected to the node that supplies the reference voltage Vref.

Figure 12:
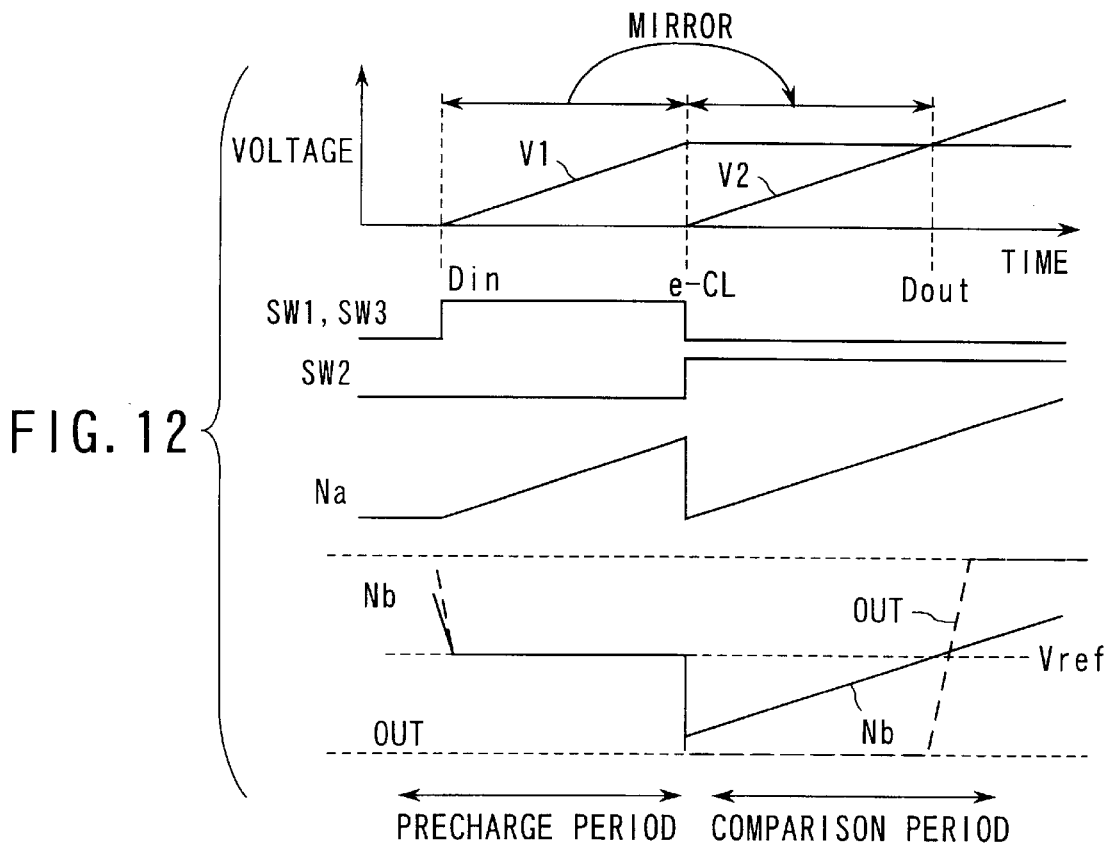
FIG. 12 is a waveform chart of some signals for explaining the operation of the comparator in FIG. 11.

The operation of the comparator 23 shown in FIG. 11 will now be discussed referring to FIG. 12. It is assumed that the switches SW1, SW2 and SW3 in FIG. 11 are enabled by an H-level signal and are disabled by an L-level signal. The operation of this comparator 23 is separated into a precharge period and a comparison period. In the precharge period, the switches SW1 and SW3 are both enabled and the switch SW2 is disabled, while in the comparison period, the switches SW1 and SW3 are both disabled and the switch SW2 is enabled.

When the pulse signal e-dmCL is supplied to the input node Din of the CBD 14 in the circuit in FIG. 3 in the precharge period, charging the capacitor C1 starts and the voltage V1 increases at a given rate. As the switch SW1 is enabled in the charge period of the capacitor C1, the voltage at the node Na or one end of the capacitor Cc likewise increases. At this time, the switch SW3 is also enabled so that the voltage at the node Nb or the other end of the capacitor Cc becomes constant and equal to the reference voltage Vref.

When the period shifts to the comparison period and the pulse signal e-CL is output from the AND gate 17, charging the capacitor C1 stops and charging the capacitor C2 starts. In synchronism with this action, the switches SW1 and SW3 are both disabled and the switch SW2 is enabled. When the switch SW1 is disabled and the switch SW2 is enabled, the voltage at the node Na or one end of the capacitor Cc becomes equal to the charge voltage V2. In the charge period of the capacitor C2, the switch SW3 is disabled so that the voltage at the node Nb or the other end of the capacitor Cc drops from Vref by (V1−V2) due to the coupling effect of the capacitor Cc. Immediately after the enabled state is switched from that of the switch SW1 to that of the switch SW2, the charge voltage V2 of the capacitor C2 is the ground voltage of 0 V so that the voltage at the node Nb drops to Vref−V1.

As the reference voltage Vref is supplied to the opposite-phase input node of the differential amplifier circuit 31, the voltage at the node Na, like the charge voltage V2 of the capacitor C2, increases later. When the charge voltage V2 reaches the reference voltage Vref, an output signal OUT of the differential amplifier circuit 31 is inverted to an "H" level from an "L" level and the previous pulse signal e-CK is output from the output node Dout of the CBD 14. In the above-described operation, even when the frequency of the external clock signal ECLK changes, thus changing the charge times of the capacitors C1 and C2, the value of the reference voltage Vref input to the differential amplifier circuit 31 is always constant. The signal delay time produced in the differential amplifier circuit 31 itself is not changed by the frequency of the external clock signal ECLK. What is more, because the reference voltage Vref can be set arbitrarily regardless of the charge voltages V1 and V2 of the capacitors C1 and C2, it is possible to select the voltage that provides the differential amplifier circuit 31 with the highest sensitivity. This can ensure a high-precision synchronization operation over a wide frequency range.

Figure 13:
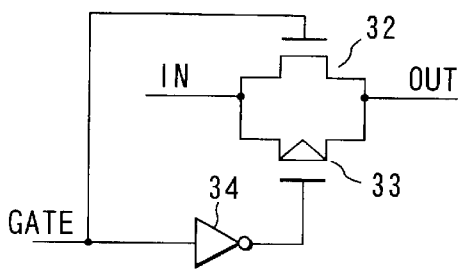
FIG. 13 is a circuit diagram depicting the detailed structure of a switch which is used in the comparator in FIG. 11.

FIG. 13 exemplifies the specific circuit of the switches SW1, SW2 and SW3 that are used in the comparator 23 in FIG. 11. As each of those switches, a CMOS transfer gate can be used which comprises an N channel MOS transistor 32 and a P channel MOS transistor 33 connected in parallel between the source and drain, and an inverter 34. The inverter 34 inverts a control signal "gate" to be used for the gate control of the N channel MOS transistor 32 and supplies the inverted signal to the gate of the MOS transistor 33.

In the first embodiment, the delay circuit in the mirror type DLL is constructed by the capacitors C1 and C2 which are charged by the constant current source circuits S1 and S2, and the comparator 23 which compares the charge voltages of those capacitors with each other, and the delay times of the forward pulse and backward pulse are converted to the quantities of charges stored in the capacitors. That is, the constant current source circuit S1 charges the capacitor C1, the constant current source circuit S2, which has the same current amount as the constant current source circuit S1, charges the capacitor C2 having the same capacitance as the capacitor C1 both for a time equivalent to the delay time of the forward pulse, the comparator 23 compares the charge voltages V1 and V2 of the capacitors C1 and C2 with each other, and a signal is output when both charge voltages coincide with each other. As the control is carried out with the delay time of the pulse signal converted to an analog quantity, therefore, it is possible to prevent the occurrence of a quantization error which occurs in the prior art.

Again, the capacitances of the capacitors C1 and C2 are set equal to each other and the current amounts of the constant current source circuits S1 and S2 are set equal to each other. Therefore, the time needed to charge the capacitor C1 to a certain voltage becomes equal to the time needed to charge the capacitor C2 to the same voltage as that certain voltage. The charge time of the capacitor C1 can be mirrored to the charge time of the capacitor C2 accurately.

In the case where the delay circuit is constructed by a plurality of logic gates as in the prior art, noise is generated as the delay circuit operates. If the delay circuit is constructed by capacitors as per this embodiment, however, generation of noise can be suppressed.

Further, the constant current source circuit can be comprised of a P channel MOS transistor or an N channel MOS transistor which is controlled by a voltage, thus providing such an advantage that the circuit structure can be simplified.

Furthermore, the differential amplifier circuit that compares the constant reference voltage Vref, which does not depend on the charge voltages of the capacitors C1 and C2, with a differential voltage between the charge voltages V1 and V2 of the capacitors C1 and C2 is used as the comparator that compares the charge voltages V1 and V2 of the capacitors C1 and C2. It is therefore possible to always make the delay time produced by the comparator constant itself by the frequency of the external clock signal. This can ensure a high-precision synchronization operation over a wide frequency range.

If the value that is obtained by dividing the capacitance of the capacitor C1 by the current amount of the constant current source circuit S1 is equal to the value that is obtained by dividing the capacitance of the capacitor C2 by the current amount of the constant current source circuit S2, i.e., if the ratio of the capacitance of the capacitor C1 to the current amount of the constant current source circuit S1 and the ratio of the capacitance of the capacitor C2 to the current amount of the constant current source circuit S2 are at a predetermined ratio, it is unnecessary to make either the capacitances of the capacitors or the current amounts of the constant current source circuits equal to each other.

The circuits that charge the capacitors C1 and C2 are not limited to constant current source circuits, but may be current source circuits.

(Second Embodiment)

Figure 14:
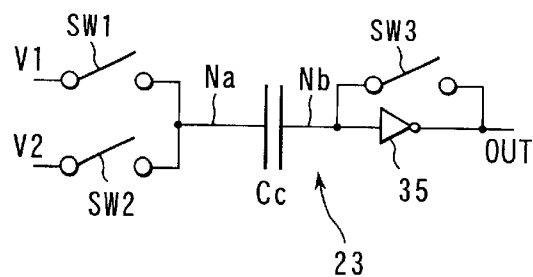
FIG. 14 is a circuit diagram illustrating the detailed structure of a comparator which is used in an analog synchronization circuit according to a second embodiment of this invention.

FIG. 14 illustrates the structure of the comparator 23 according to a second embodiment of this invention. This comparator 23 uses an inverter 35 as an amplifier circuit in place of the differential amplifier circuit 31 of the comparator shown in FIG. 11. As the inverter 35 has only one input node, the circuit threshold voltage of the inverter 35 is used instead of the reference voltage Vref. The circuit threshold voltage of the inverter 35 is automatically generated when the input node and the output node are short-circuited.

Figure 15:
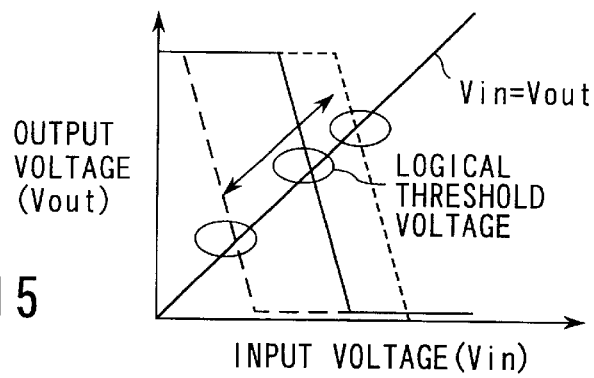
FIG. 15 is a diagram showing the input/output characteristics of an inverter which is used in the comparator in FIG. 14.

FIG. 15 shows the ordinary input/output characteristics of an inverter. Short-circuiting the input node and the output node makes an input voltage Vin and output voltage Vout of the inverter coincide with each other. Even if the input/output characteristics change due to a process variation (the characteristic indicated by the broken line in the diagram), the input/output characteristics are corrected to the characteristic indicated by the solid line so that the circuit threshold voltage of the inverter is set to a logical threshold voltage at the intersection between a straight line of Vin=Vout and the input/output characteristic curve.

In this embodiment, therefore, the switch SW3 is connected between the input node and output node of the inverter 35.

Figure 16:
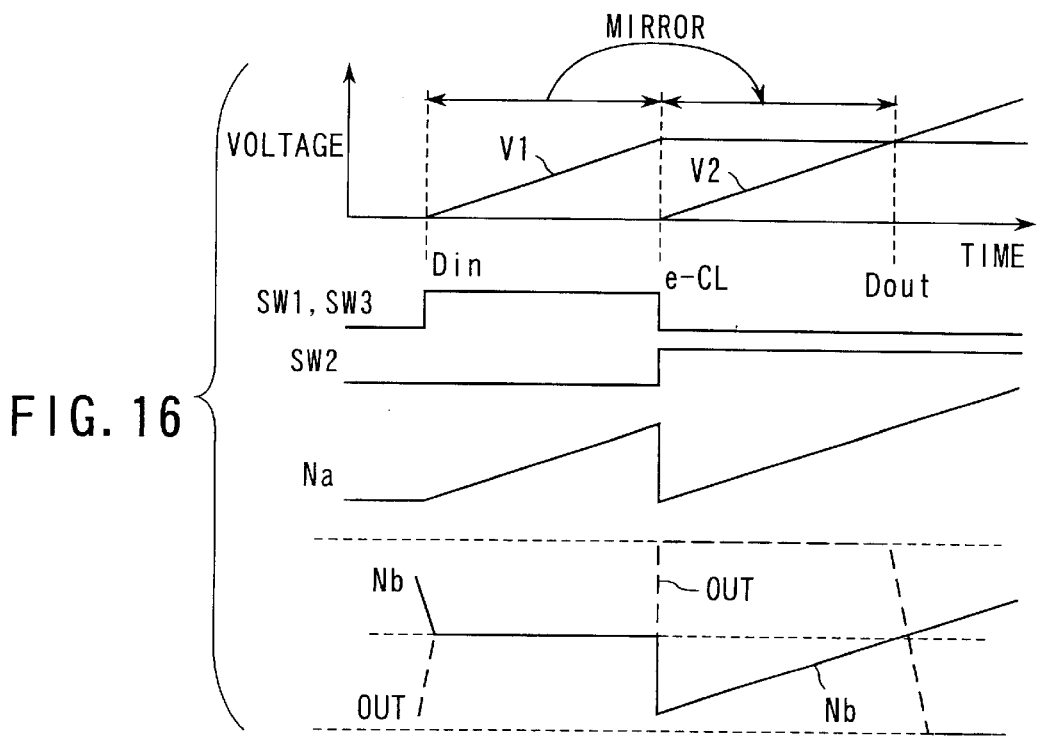
FIG. 16 is a waveform chart of some signals for explaining the operation of the comparator in FIG. 14.

FIG. 16 shows the waveforms of signals at the individual nodes of the comparator 23 shown in FIG. 14. As the comparator in FIG. 14 uses the inverter 35 in place of the differential amplifier circuit 31 in FIG. 11, the logic level of the output signal OUT of the inverter 35 is inverted to the logic level of the output signal OUT of the differential amplifier circuit 31. To acquire the output signal OUT that has the same logic level as shown in FIG. 11, an inverter should be provided at the subsequent stage of the inverter 35 to invert the signal OUT.

In this embodiment too, even if the frequency of the external clock signal ECLK changes, thus changing the charge times of the capacitors C1 and C2, the value of the circuit threshold voltage of the inverter 35 is always constant. Therefore, the signal delay time produced in the comparator itself is not changed by the frequency of the external clock signal ECLK. What is more, the circuit threshold voltage of the inverter 35 is automatically set to almost an intermediate value between the supply voltage and the ground voltage, irrespective of the charge voltages V1 and V2 of the capacitors C1 and C2. This set voltage provides the inverter 35 with the highest sensitivity to ensure a high-precision synchronization operation over a wide frequency range.

(Third Embodiment)

A description will now be given of an embodiment which reduces a change in the input capacitance of the comparator 23 between the period where the capacitor C1 is charged and the period where the capacitor C2 is charged.

Figure 17:
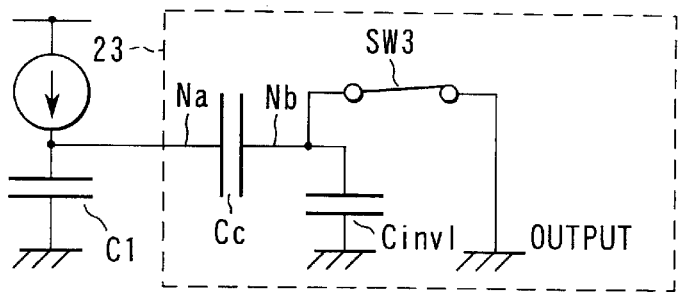
FIG. 17 is an equivalent circuit diagram of an analog synchronization circuit including the comparator in FIG. 11 or FIG. 14.
Figure 18:
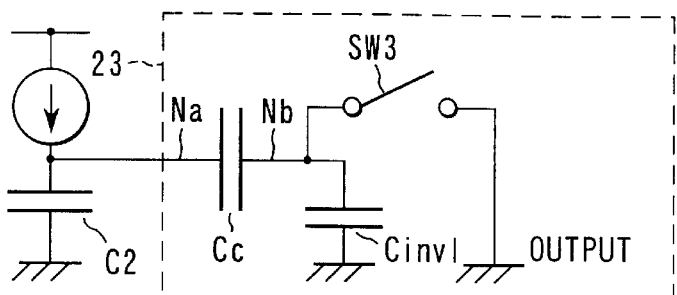
FIG. 18 is an equivalent circuit diagram of an analog synchronization circuit including the comparator in FIG. 11 or FIG. 14.

That is, the input capacitance of the comparator 23 differs between the charge periods of the capacitors C1 and C2. Here, Cinvl denotes the input capacitance of the differential amplifier circuit 31 in FIG. 11 or the amplifier circuit comprised of the inverter 35 in FIG. 14. In the precharge period of the comparator 23 where the capacitor C1 is charged, the switches SW1 and SW3 are enabled and the switch SW2 is disabled, the input capacitance Cinvl of the amplifier circuit disappears due to the enabled switch SW3 as indicated by an equivalent circuit in FIG. 17, So that the input capacitance of the comparator 23 becomes only the capacitance of the capacitor Cc. In the comparison period of the comparator 23 where the capacitor C2 is charged and only the switch SW2 is enabled, on the other hand, the switch SW3 is disabled so that the input capacitance Cinvl of the amplifier circuit is connected in series to the capacitor Cc as indicated by an equivalent circuit in FIG. 18. The input capacitance of the comparator 23 therefore becomes Cinvl// Cc which represents a series capacitance of Cinvl and Cc and is Cinvl Cc/(Cinvl+Cc). If the input capacitance of the comparator 23 differs between the precharge period and the comparison period, the charge speeds for the capacitors C1 and C2 differ from each other and this difference appears on the output as a synchronization error.

Figure 19A:
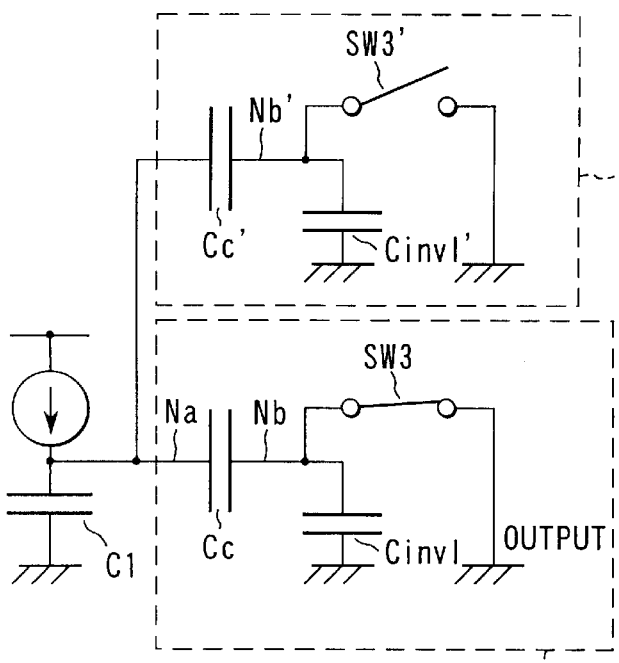
FIGS. 19A and 19B are equivalent circuit diagrams for explaining the principle of an analog synchronization circuit according to a third embodiment of this invention.
Figure 19B:
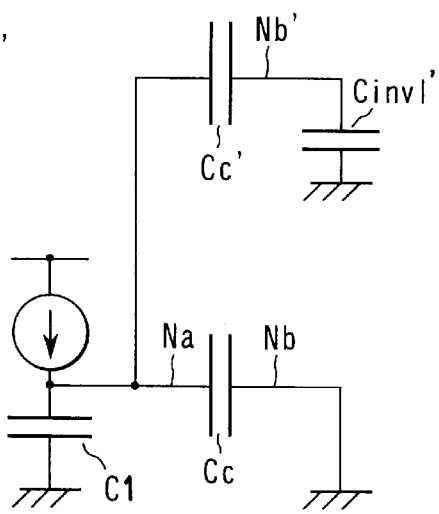

In this embodiment, therefore, a dummy circuit 23' whose circuit structure excluding the two switches SW1 and SW2 is equivalent to the circuit structure of the comparator 23 as indicated by equivalent circuits in FIGS. 19A and 19B is added. A capacitor Cc' in the dummy circuit 23' has the same capacitance as the capacitor Cc in the comparator 23 and has one node connected to the node Na. Cinvl' denotes a capacitance equal to the input capacitance Cinvl of the amplifier circuit in the comparator 23 and the other node Nb' of the capacitor Cc' is connected to this input capacitance Cinvl'. A switch Sw3' has the same structure as the switch SW3 in the comparator 23 except that the switch SW3' is so controlled as to operate in the opposite phase to the phase of the switch SW3.

In the equivalent circuit in FIG. 19A, the switch SW3 in the comparator 23 is enabled and the switch SW3' in the dummy circuit 23' is disabled. This equivalent circuit is shown in a simpler form in the equivalent circuit diagram of FIG. 19B.

The state where the switch SW3 in the comparator 23 becomes disabled and the switch SW3' in the dummy circuit 23' becomes enabled also becomes the same equivalent circuit as shown in the equivalent circuit diagram of FIG. 19B.

Figure 20:
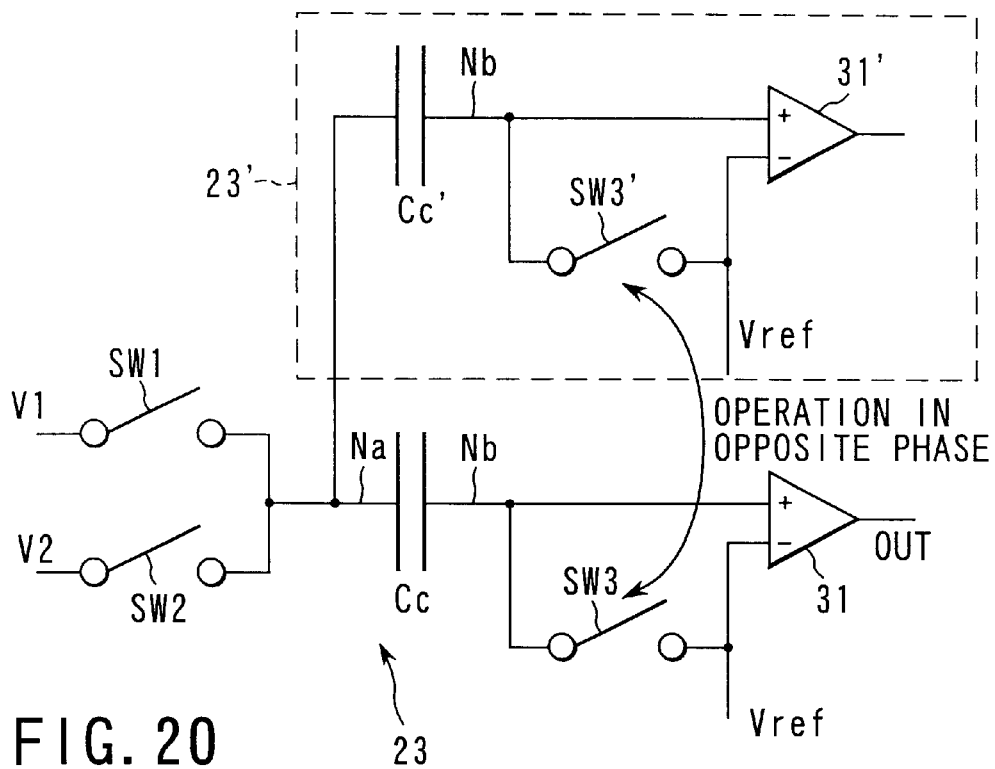
FIG. 20 is a circuit diagram illustrating the detailed structure of a comparator which is used in the analog synchronization circuit according to the third embodiment of this invention.

FIG. 20 illustrates such a view adapted to the comparator which uses the differential amplifier circuit 31 as an amplifier circuit as shown in FIG. 11. The circuit in FIG. 20 is the circuit in FIG. 11 to which the dummy circuit 23', which comprises a capacitor Cc', a differential amplifier circuit 31' and a switch SW3', is added.

Figure 21:
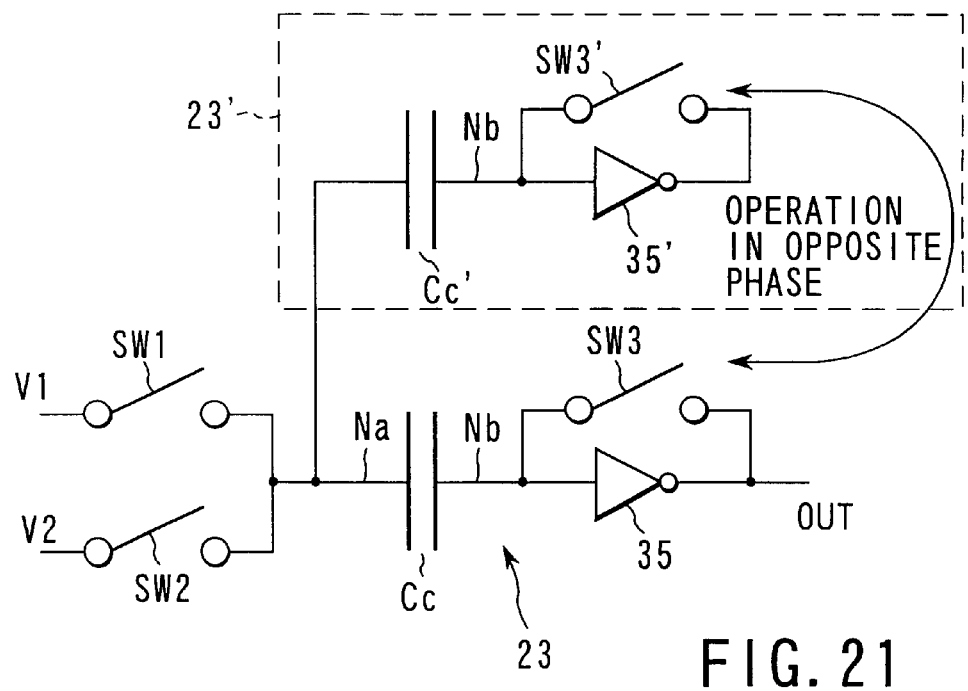
FIG. 21 is a circuit diagram illustrating the detailed structure of a comparator which is used in the analog synchronization circuit according to the third embodiment of this invention and differs from the comparator shown in FIG. 20.

FIG. 21 illustrates such a view adapted to the comparator which uses the inverter 35 as an amplifier circuit as shown in FIG. 14. The circuit in FIG. 21 is the circuit in FIG. 14 to which the dummy circuit 23', which comprises a capacitor Cc', an inverter 35' and a switch SW3', is added.

According to this embodiment, adding the dummy circuit 23', this way can make the input capacitance of the comparator 23 identical at both times of charging the capacitors C1 and C2, so that the charge speeds for the capacitors C1 and C2 become equal to each other. This can provide a further advantage of reducing a synchronization error which is caused by the difference in the input capacitance of the comparator 23.

(Fourth Embodiment)

While the value of the reference voltage of the comparator 23 becomes always constant regardless of the frequency of the external clock signal so that a variation in the delay time of the comparator 23 can be suppressed small in the above-described first to third embodiments, a fourth embodiment to be discussed below can further suppress the variation.

Even with the constant value of the comparison voltage, the speed of the input voltage to the comparator changes to this comparison voltage varies, the delay time changes. It is therefore desirable that the charge speeds of the capacitors C1 and C2 be constant regardless of the period of the external clock signal. The charge speed of each capacitor C1 or C2 is represented by $dV/dt = Ic/(Ccap+Ccom)$ where Ic is the amount of the current of the constant current source circuit S1 or S2, Ccap is the capacitance of the capacitor C1 or C2 and Ccom is the input capacitance of the comparator 23. To make dV/dt constant, Ic should be constant and the capacitance of (Ccap+Ccom) should also be constant.

Figure 22A:
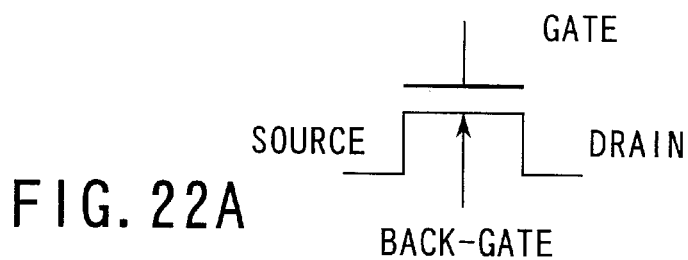
FIGS. 22A and 22B are a symbol diagram of an MOS transistor and a cross-sectional view showing a device structure in a case where a capacitor used in each of the aforementioned embodiments is realized in an LSI.
Figure 22B:
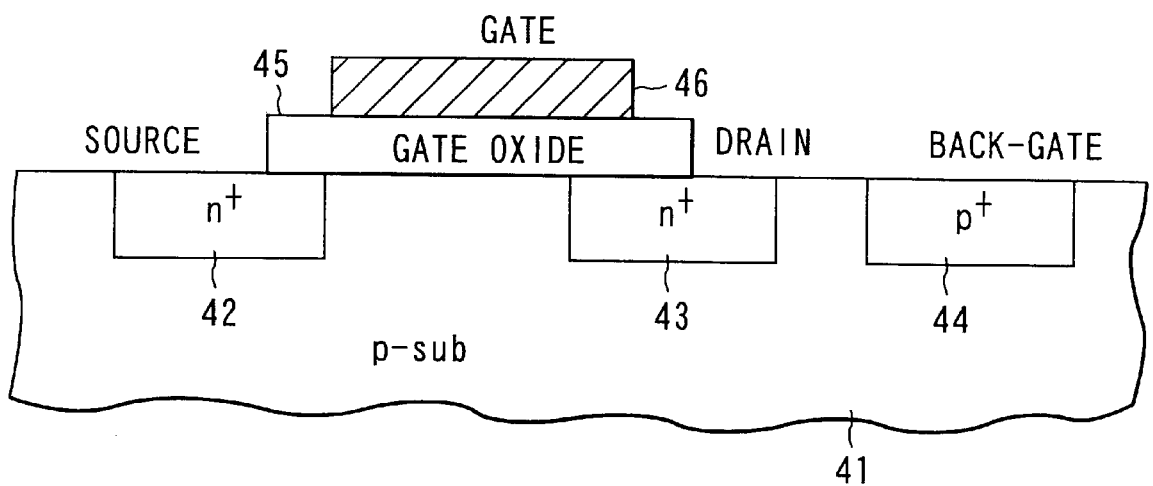

In general, the capacitors C1 and C2 are often constructed in an LSI by using MOS transistors shown by a symbol in FIG. 22A. FIG. 22B shows the device structure of the MOS transistor shown in FIG. 22A. Specifically, a source 42 and a drain 43, which are formed by an $n^+$-type diffusion area, and a back-gate contact (back-gate) 44 formed by a $p^+$-type diffusion area are provided on a p-type semiconductor area (p-sub) 41, and a gate electrode (gate) 46 is provided on a channel area between the source and drain via a gate insulating film (gate oxide) 45.

Figure 23:
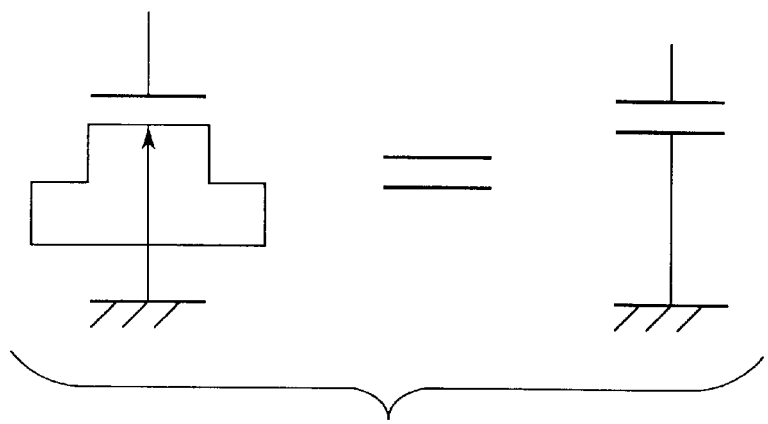
FIG. 23 is a diagram showing an MOS capacitor which is comprised of the MOS transistor shown in FIG. 22.

As shown in FIG. 23, an MOS capacitor is used which has the source and drain of the MOS transistor short-circuited and the back-gate connected to the node of the ground voltage so that a gate capacitor produced between the gate electrode and the back-gate is used as the aforementioned capacitor.

FIG. 24A shows the relationship between the gate voltage V(gate) and the capacitance C(gate) with respect to the back-gate of the N channel MOS transistor shown in FIG. 22A. As apparent from FIG. 24A, as the gate voltage V(gate) is charged up from the ground voltage ($V_{SS}$) of 0V when the back-gate voltage is the ground voltage, the capacitance varies in accordance with the charge voltage in the depletion period for the voltage to reach a threshold voltage Vth.

In this embodiment, therefore, MOS transistors whose threshold voltages Vth are lower than that of an ordinary MOS transistor are used as the capacitors C1 and C2, so that the area where the gate capacitance varies is suppressed to an area where the gate voltage is low, thus allowing the gate capacitance to become constant when the gate voltage rises to a certain level. Further, the use of depletion type MOS transistors allows the capacitors C1 and C2 to operate in the inversion area even when the gate voltage is equal to the ground voltage, thus making the gate capacitance constant as shown in FIG. 24B.

(Fifth Embodiment)

The foregoing description of the fourth embodiment has been given of the case where an MOS capacitor which operates in the inversion area is used as a capacitor having a constant capacitance. In the case of a polysilicon MOS transistor which uses polysilicon as a conductive material for the gate electrode, however, the transformation of the gate to a depletion layer in the inversion area reduces the gate capacitance as shown in FIG. 24C. To avoid this influence, the MOS transistor should operate in the accumulation area. An N channel MOS transistor may be permitted to operate in the accumulation area by, for example, setting the back-gate at the supply voltage $V_{CC}$. To set the back-gate at the supply voltage $V_{CC}$, the back-gate of the N channel MOS transistor should be electrically isolated from the substrate.

Figure 25:
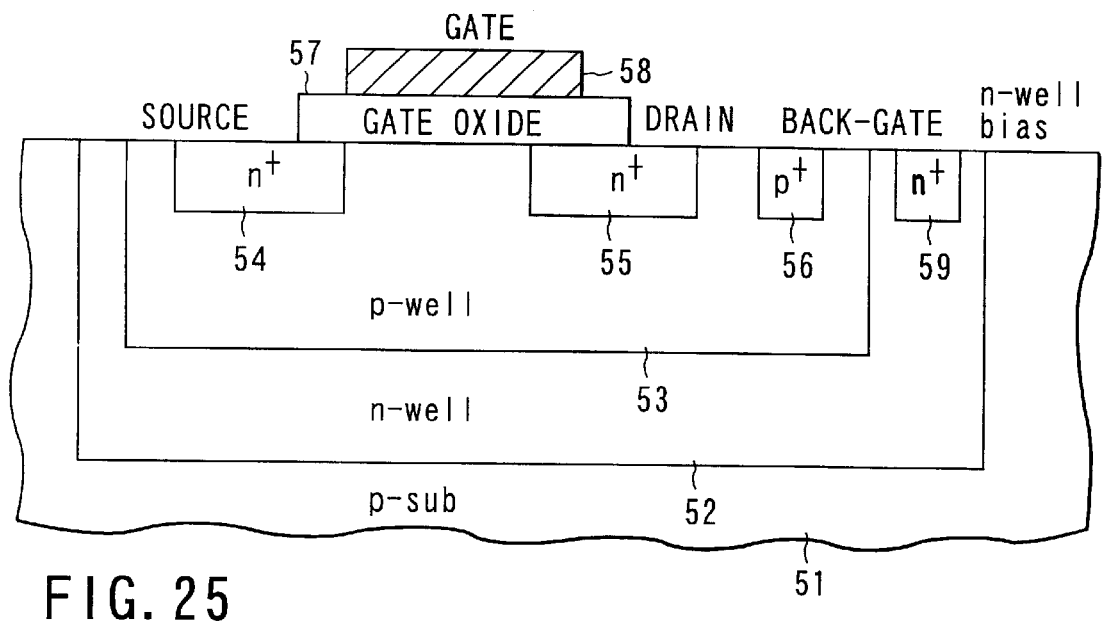
FIG. 25 is a cross-sectional view showing the device structure of an N channel MOS transistor which is used in the fifth embodiment.

For this purpose, an N channel MOS transistor which has a device structure as shown in FIG. 25 is used. In FIG. 25, an n-type well area (n-well) 52 is provided on a p-type semiconductor area (p-sub) 51, a p-type well area (p-well) 53 is provided on this n-type well area 52, and a source 54 and a drain 55, which are formed by an $n^+$-type diffusion area, and a back-gate contact (back-gate) 56 formed by a $p^+$-type diffusion area are provided on this p-type well area 53. Further, a gate electrode (gate) 58 is provided on a channel area between the source and drain via a gate insulating film (gate oxide) 57. A well contact 59 formed by an $n^+$-type diffusion area, which supplies a predetermined bias voltage (n-well bias) to the n-type well area 52, is formed in the n-type well area 52.

Figure 26:
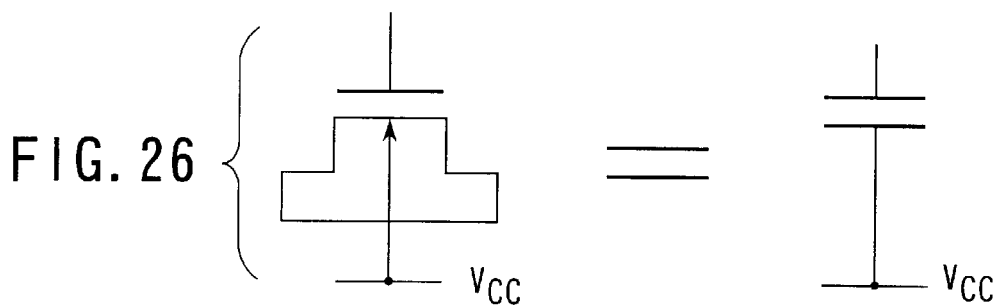
FIG. 26 is a diagram depicting an MOS capacitor which is comprised of the MOS transistor shown in FIG. 25.

Connecting the back-gate contact 56 together with the well contact 59 to the supply voltage $V_{CC}$ by using this triple well structure can allow the back-gate of the MOS capacitor to be set to the supply voltage $V_{CC}$ as shown in an equivalent circuit in FIG. 26, so that the MOS capacitor can operate in the accumulation area. The relationship between the gate voltage V(gate) and the capacitance C(gate) becomes the one shown in FIG. 24D, which shows that the gate capacitance always becomes constant with respect to the gate voltage.

The formation of a p-type well area electrically isolated from a p-type semiconductor area by an n-type well area is usually done for a DRAM to isolate a cell area from the substrate, so that the device fabricating steps are not increased if the isolation of the p-type well area is executed in this forming step.

(Sixth Embodiment)

The foregoing description of the fifth embodiment has been given of the case where the well contact or the back-gate of an MOS capacitor is connected to the supply voltage $V_{CC}$ by utilizing the triple well structure. In an LSI which cannot employ the triple well structure, however, a p-type well area (p-well) should be formed on an n-type semiconductor area (n-sub) and the supply voltage $V_{CC}$ should be connected to the p-well area that is the back-gate of an N channel MOS transistor formed in the p-type well area.

If an n-type semiconductor area (n-sub) cannot be used, a P channel MOS transistor which has an n-type well area (n-well) formed on a p-type semiconductor area (p-sub) can be used. While the n-type semiconductor area (n-sub) is normally biased to the supply voltage $V_{CC}$, only the n-type well area (n-well) where an MOS capacitor (C1, C2) is formed should be biased to the ground voltage. In this case, it is desirable that the MOS capacitor (C1, C2) should previously be reset to the supply voltage $V_{CC}$ and discharged to the ground voltage from that level, instead of being charged to the supply voltage $V_{CC}$ from the ground voltage and then reset to the ground voltage as in the case of FIG. 3.

(Seventh Embodiment)

The foregoing description of the first to sixth embodiments has been given of the case where the ground voltage or the supply voltage $V_{CC}$ is used as the reset voltage for the capacitors C1 and C2. If an MOS transistor which is used as an MOS capacitor can operate in the inversion area or the accumulation area as intended, however, another voltage may be used as well. In the seventh embodiment, a reset voltage different from the ground voltage and the supply voltage $V_{CC}$ is used.

(Eighth Embodiment)

Figure 27:
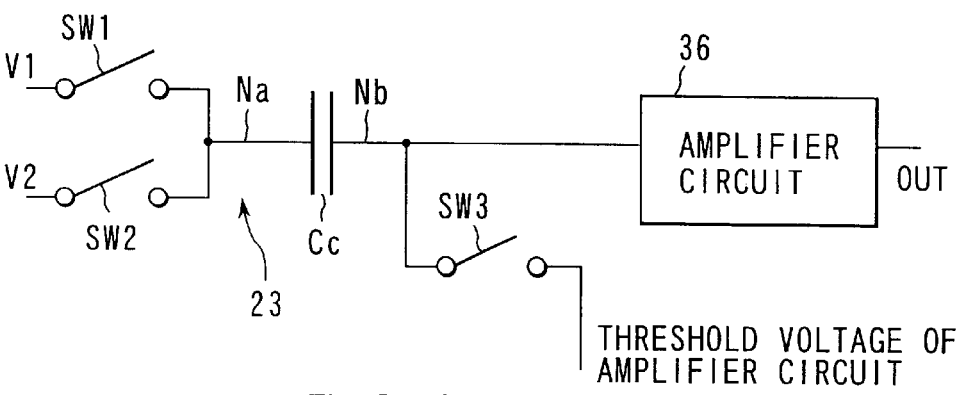
FIG. 27 is a circuit diagram illustrating the detailed structure of a comparator which is used in an analog synchronization circuit according to an eighth embodiment of this invention.

The foregoing description of the individual embodiments has been given of the case where a differential amplifier circuit or an inverter is used as an amplifier circuit in the comparator 23. In the eighth embodiment, as shown in FIG. 27, an amplifier circuit 36 different from the differential amplifier circuit or the inverter is used. In this case, the switch SW3 is supplied with a voltage equivalent to the circuit threshold voltage of the amplifier circuit 36 instead of the reference voltage Vref.

According to this invention, as described above, the delay time can be detected in terms of the quantity of charges or an analog quantity, making is possible to prevent the production of a quantization error which undesirably occurs in the conventional mirror type DLL that uses logic gates for a delay line. It is therefore possible to provide an analog synchronization circuit which can make the amount of delay of the forward pulse equal to the amount of delay of the backward pulse.

What is more, the comparator that compares the charge voltages of two capacitors with each other to acquire an output signal uses a constant voltage, which does not depend on the charge voltages of the capacitors, as the reference voltage in the comparison operation. Therefore, the delay time produced in the comparator itself by the frequency of the external clock signal can always be made constant, thus ensuring a high-precision synchronization operation over a wide frequency range.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An analog synchronization circuit comprising:
   a first capacitor;
   a first current source circuit for starting charging said first capacitor in accordance with a first clock signal and stopping the charging in accordance with a second clock signal delayed from said first clock signal;
   a second capacitor;

a second current source circuit for starting charging said second capacitor in accordance with said second clock signal; and a comparator circuit for comparing charge voltages of said first and second capacitors with each other and generating a timing signal when said charge voltages coincide with each other, said comparator circuit including, a first switch having one end supplied with said charge voltage of said first capacitor, a second switch having one end supplied with said charge voltage of said second capacitor and the other end connected to the other end of said first switch, a third capacitor having one end connected to a common node between said other ends of said first and second switches, a first amplifier circuit having an input node connected to the other end of said third capacitor and an output node from which said timing signal is output, and a third switch for controlling supply of a voltage equivalent to a threshold voltage of said first amplifier circuit to said other end of said third capacitor, wherein when said first and third switches are enabled, said second switch is controlled to be disabled, and when said second switch is enabled, said first and third switches are controlled to be disabled.

2. The analog synchronization circuit according to claim 1, wherein a ratio of a capacitance of said first capacitor to an amount of a current of said first current source circuit is substantially equal to a ratio of a capacitance of said second capacitor to an amount of a current of said second current source circuit.

3. The analog synchronization circuit according to claim 1, further comprising:

a first reset circuit, connected to said first capacitor, for resetting said charge voltage of said first capacitor in accordance with said first clock signal; and a second reset circuit, connected to said second capacitor, for resetting said charge voltage of said second capacitor in accordance with an output signal of said comparator circuit.

4. The analog synchronization circuit according to claim 1, wherein said first amplifier circuit is a differential amplifier circuit having one input node connected to said other end of said third capacitor and the other input node to which said voltage equivalent to said threshold voltage is input.

5. The analog synchronization circuit according to claim 1, wherein said first amplifier circuit is an inversion circuit having an input node connected to said other end of said third capacitor and an output node, and said third switch is connected between said input node and said output node of said inversion circuit.

6. The analog synchronization circuit according to claim 1, further comprising:

a fourth capacitor having one end connected to said common node between said other ends of said first and second switches and having a capacitance substantially equal to a capacitance of said third capacitor;

a second amplifier circuit having a circuit structure equivalent to that of said first amplifier circuit and having an input node connected to an other end of said fourth capacitor; and a dummy circuit having a fourth switch which controls supply of a voltage equivalent to a threshold voltage of said second amplifier circuit to said other end of said fourth capacitor and operates in an opposite phase to a phase of said second switch.

7. The analog synchronization circuit according to claim 6, wherein each of said first to fourth switches is comprised of a CMOS transfer gate.

8. The analog synchronization circuit according to claim 1, wherein each of said first and second capacitors is comprised of a MOS capacitor using a MOS transistor operable in an inversion area.

9. The analog synchronization circuit according to claim 8, wherein said MOS transistor is a transistor having a low threshold voltage and having a back-gate connected to a node to which a ground voltage is supplied.

10. The analog synchronization circuit according to claim 8, wherein said MOS transistor is a depletion type transistor having a back-gate connected to a node to which a ground voltage is supplied.

11. The analog synchronization circuit according to claim 1, wherein each of said first and second capacitors is comprised of a MOS capacitor using a MOS transistor operable in an accumulation area.

12. The analog synchronization circuit according to claim 11, wherein said MOS transistor is formed in a p-type well area of a semiconductor substrate having a p-type semiconductor area, an n-type well area formed on said p-type semiconductor area and said p-type well area formed in said n-type well area; and a supply voltage is supplied to said n-type well area and said p-type well area.

13. The analog synchronization circuit according to claim 11, wherein said MOS transistor is formed in a p-type well area of a semiconductor substrate having an n-type semiconductor area and said p-type well area formed in said n-type semiconductor area; and a supply voltage is supplied to said p-type well area.

14. The analog synchronization circuit according to claim 11, wherein said MOS transistor is formed in an n-type well area of a semiconductor substrate having a p-type semiconductor area and said n-type well area formed in said p-type semiconductor area; and a ground voltage is supplied to said n-type well area.

15. An analog synchronization circuit comprising:

an input buffer to be supplied with an external clock signal;

a first logic circuit for alternately extracting a first clock signal and a second clock signal for each cycle of a clock signal output from said input buffer;

a delay monitor to be supplied with said clock signal output from said input buffer;

a second logic circuit for alternately extracting a third clock signal and a fourth clock signal for each cycle of a clock signal output from said delay monitor;

a first charge balance delay circuit for receiving said first clock signal output from said first logic circuit and said third clock signal output from said second logic circuit and outputting a fifth clock signal;

a second charge balance delay circuit for receiving said second clock signal output from said first logic circuit and said fourth clock signal output from said second logic circuit and outputting a sixth clock signal;

a synthesizing circuit for receiving said fifth clock signal and said sixth clock signal and synthesizing both clock signals; and an output buffer for outputting an internal clock signal synchronous with said external clock signal from an output signal of said synthesizing circuit, said first charge balance delay circuit including,
  a first capacitor;
  a first current source circuit for starting charging said first capacitor in accordance with said third clock signal and stopping the charging in accordance with said first clock signal;
  a second capacitor;
  a second current source circuit for starting charging said second capacitor in accordance with said first clock signal, and
  a first comparator circuit for comparing charge voltages of said first and second capacitors with each other and generating a timing signal when said charge voltages coincide with each other,
said second charge balance delay circuit including,
  a third capacitor;
  a third current source circuit for starting charging said third capacitor in accordance with said fourth clock signal and stopping the charging in accordance with said second clock signal;
  a fourth capacitor;
  a fourth current source circuit for starting charging said fourth capacitor in accordance with said second clock signal; and
  a second comparator circuit for comparing charge voltages of said third and fourth capacitors with each other and generating a timing signal when said charge voltages coincide with each other,
said first comparator circuit including,
  a first switch having one end supplied with said charge voltage of said first capacitor;
  a second switch having one end supplied with said charge voltage of said second capacitor and an other end connected to an other end of said first switch;
  a fifth capacitor having one end connected to a common node between said other ends of said first and second switches;
  a first amplifier circuit having an input node connected to the other end of said fifth capacitor and an output node from which said timing signal is output; and
  a third switch for controlling supply of a voltage equivalent to a threshold voltage of said first amplifier circuit to said other end of said fifth capacitor,
    wherein when said first and third switches are enabled, said second switch is controlled to be disabled, and when said second switch is enabled, said first and third switches are controlled to be disabled,
said second comparator circuit including,
  a fourth switch having one end supplied with said charge voltage of said third capacitor;
  a fifth switch having one end supplied with said charge voltage of said fourth capacitor and the other end connected to the other end of said fourth switch;
  a sixth capacitor having one end connected to a common node between said other ends of said fourth and fifth switches,
  a second amplifier circuit having an input node connected to the other end of said sixth capacitor and an output node from which said timing signal is output; and
  a sixth switch for controlling supply of a voltage equivalent to a threshold voltage of said second amplifier circuit to said other end of said sixth capacitor,
    wherein when said fourth and sixth switches are enabled, said fifth switch is controlled to be disabled, and when said fifth switch is enabled, said fourth and sixth switches are controlled to be disabled.

* * * * *